(12) United States Patent  
Kundaliya et al.

(10) Patent No.: US 9,373,761 B2  
(45) Date of Patent: Jun. 21, 2016

(54) PATTERNED THIN-FILM WAVELENGTH CONVERTER AND METHOD OF MAKING SAME

(71) Applicants: Darshan Kundaliya, Beverly, MA (US); Jörg Frischeisen, Schwabmünchen (DE); Alan Lenef, Belmont, MA (US); Jörg-Erich Sorg, Regensburg (DE); Norwin von Malm, Thumhausen (DE)

(72) Inventors: Darshan Kundaliya, Beverly, MA (US); Jörg Frischeisen, Schwabmünchen (DE); Alan Lenef, Belmont, MA (US); Jörg-Erich Sorg, Regensburg (DE); Norwin von Malm, Thumhausen (DE)

(73) Assignee: OSRAM SYLVANIA Inc., Wilmington, MA (US)

( * ) Notice: Subject to any disclaimer, the term of this patent is extended or adjusted under 35 U.S.C. 154(b) by 0 days.

(21) Appl. No.: 14/494,281

(22) Filed: Sep. 23, 2014

(65) Prior Publication Data

US 2016/0087167 A1    Mar. 24, 2016

(51) Int. Cl.
*H01L 33/50* (2010.01)
*H01L 33/00* (2010.01)
*H01L 33/44* (2010.01)

(52) U.S. Cl.
CPC ............ *H01L 33/508* (2013.01); *H01L 33/005* (2013.01); *H01L 33/502* (2013.01); *H01L 33/505* (2013.01); *H01L 33/44* (2013.01); *H01L 33/507* (2013.01); *H01L 2933/0041* (2013.01); *H01L 2933/0091* (2013.01)

(58) Field of Classification Search
CPC ................. H01L 2933/0041; H01L 31/02168; H01L 33/50; H01L 33/58
See application file for complete search history.

(56) References Cited

U.S. PATENT DOCUMENTS

| | | | | |
|---|---|---|---|---|
| 7,888,698 B2 * | 2/2011 | Wu | ........................ | H01L 33/508 257/100 |
| 8,177,391 B2 * | 5/2012 | Ryu | .......................... | F21V 5/04 362/249.02 |
| 8,492,182 B2 | 7/2013 | von Malm et al. | | |
| 8,748,921 B2 * | 6/2014 | Martin | ....................... | C03C 3/12 257/100 |
| 2005/0179130 A1 * | 8/2005 | Tanaka | ................. | H01L 21/0237 257/730 |
| 2007/0267646 A1 * | 11/2007 | Wierer | .................... | B82Y 20/00 257/98 |
| 2008/0274574 A1 * | 11/2008 | Yun | ...................... | H01L 33/0075 438/47 |
| 2010/0288352 A1 * | 11/2010 | Ji | .......................... | H01L 31/0549 136/256 |
| 2010/0308359 A1 * | 12/2010 | Singh | ..................... | H01L 33/007 257/98 |

(Continued)

*Primary Examiner* — Jaehwan Oh
(74) *Attorney, Agent, or Firm* — Robert F. Clark

(57) ABSTRACT

There is herein described a patterned thin-film wavelength converter which comprises a substrate having a first patterned surface with a first pattern, and a thin film deposited on the first patterned surface. The thin film consists of a wavelength converting material and has a second patterned surface that is distal from the substrate. The second patterned surface has a second pattern that is substantially the same as the first pattern of the substrate. An advantage of the patterned thin-film wavelength converter is that post-deposition processing is not required to produce a textured surface on the wavelength converting material. A method of making the patterned thin-film wavelength converter is also described.

14 Claims, 7 Drawing Sheets

(56) References Cited

U.S. PATENT DOCUMENTS

| | | | |
|---|---|---|---|
| 2011/0235355 A1* | 9/2011 | Seko | F21S 48/1154 362/510 |
| 2012/0153311 A1* | 6/2012 | Yuan | F21K 9/90 257/88 |
| 2012/0243220 A1* | 9/2012 | Yamamoto | H01L 33/54 362/231 |
| 2012/0248469 A1* | 10/2012 | Choi | H01L 25/0753 257/88 |
| 2012/0261688 A1 | 10/2012 | Raukas et al. | |
| 2013/0213703 A1* | 8/2013 | Kawaguchi | C23C 14/0042 174/257 |
| 2013/0313603 A1 | 11/2013 | Kundaliya et al. | |
| 2013/0328096 A1* | 12/2013 | Donofrio | H01L 33/12 257/99 |
| 2014/0042470 A1* | 2/2014 | Hsu | H01L 33/505 257/98 |
| 2014/0168988 A1* | 6/2014 | Petersen | H01L 33/505 362/293 |
| 2015/0060917 A1* | 3/2015 | Vampola | H01L 33/504 257/98 |
| 2015/0129915 A1* | 5/2015 | Lee | H01L 33/20 257/98 |
| 2015/0214444 A1* | 7/2015 | Watanabe | H01L 33/502 257/98 |
| 2016/0025921 A1* | 1/2016 | Park | G02F 1/133606 362/84 |

* cited by examiner

US 9,373,761 B2

PATTERNED THIN-FILM WAVELENGTH CONVERTER AND METHOD OF MAKING SAME

TECHNICAL FIELD

The present disclosure generally relates to wavelength converters and, more particularly, to surface texturing of wavelength converters for solid state light emitting devices.

BACKGROUND OF THE INVENTION

Solid state light sources such as light emitting diodes (LEDs) generate visible or non-visible light in a specific region of the electromagnetic spectrum depending on the material composition of the LED. When it is desired to construct an LED light source that produces a color different from the output color of the LED, it is known to convert the LED light output having a peak wavelength ("primary light") to light having a different peak wavelength ("secondary light") using photoluminescence.

Photoluminescence generally involves absorbing higher energy primary light by a wavelength converting material ("conversion material") such as a phosphor or mixture of phosphors. This absorption excites the conversion material to a higher energy state. When the conversion material returns to a lower energy state, it emits secondary light, generally of a longer wavelength than the primary light. The peak wavelength of the secondary light can depend on the type of phosphor material. This process may be generally referred to as "wavelength conversion." An LED combined with a wavelength converting structure that includes a conversion material such as phosphor to produce secondary light may be described as a "phosphor-converted LED" or "wavelength converted LED."

In a known configuration, an LED die such as a III-nitride die is positioned in a reflector cup package and a volume. To convert primary light to secondary light, a wavelength converting structure ("wavelength converter") may be provided. The wavelength converter may be integrated in the form of a self-supporting plate, such as a ceramic plate or a single crystal plate. In any case, the wavelength converter may be attached directly to the LED, e.g. by wafer bonding, sintering, gluing, etc. Such a configuration may be understood as "chip level conversion" or "CLC." Alternatively, the wavelength converter may be positioned remotely from the LED. Such a configuration may be understood as "remote conversion."

In one particular known configuration, the wavelength converter can be constructed as a thin film, typically deposited on a transparent substrate material such as sapphire. For example, U.S. Patent Publication 2012/0261688 describes a wavelength converting thin film structure having a non-uniform top surface created during deposition of the wavelength converting material on a polished sapphire substrate. In another example, U.S. Patent Publication 2013/0313603 describes an epitaxial wavelength converting thin film structure on a transparent substrate such as $Gd_3Ga_5O_{12}$ or $Y_3Al_5O_{12}$ whereby the emission wavelength of the conversion material may be tuned by lattice strain engineering instead of by varying the elemental composition.

One potential issue with thin-film wavelength converters is that they are likely to have fewer scattering centers (e.g., grain boundaries) compared to ceramic wavelength converters formed by sintering powdered materials or casting resins containing dispersions of phosphor particles. This means that the thin-film converters are more likely to experience losses due to total internal reflection (TIR). Light extraction may be improved by roughening the surface of the converter, e.g., mechanical abrasion, chemical etch, etc. However, these techniques may produce a generally uncontrolled effect with varying degrees of surface roughening and the thickness of the thin film may limit their application.

SUMMARY OF THE INVENTION

It is an object of the invention to obviate the disadvantages of the prior art.

It is another object of the invention to provide a thin-film wavelength converter having a patterned surface.

It is a further object of the invention to provide a method of making a thin-film wavelength converter having a patterned surface.

In accordance with one object of the invention, there is provided a patterned thin-film wavelength converter. The converter comprises a substrate having a patterned surface on which a thin film of a wavelength converting material is deposited. A surface of the thin film distal from the substrate has a pattern that is substantially the same as the pattern of the patterned surface of the substrate.

In accordance with another object of the invention, there is provided a method of making a patterned thin-film wavelength converter, comprising:
(a) obtaining a substrate having a patterned surface with a pattern of features;
(b) depositing a thin film consisting of a wavelength converting material on the patterned surface of the substrate so that a surface of the thin film distal from the substrate has a pattern that is substantially the same as the pattern of the substrate.

The patterned thin-film converters of this invention offer several potential advantages for various solid state lighting applications, including enhanced light extraction, thermal performance, simplified processing, and more robust handling. Surface patterns may be engineered directly on substrates which are easier to process than thin films and may be formed by conventional semiconductor fabrication processes such as photolithography. Moreover, commercially available patterned sapphire substrates are already used as epitaxial growth substrates for light emitting diodes. There is no need to pattern the surface of the thin film after depositing the film since the substrate's pattern transfers to the other side of the thin film resulting in a similarly patterned surface.

Because the thin film may be deposited directly on the substrate, no bonding material is needed to attach the conversion material to the substrate which might interfere with heat transfer to the substrate or which might diffuse into the conversion material causing degradation of the light quality. In addition, the structured surface at the interface provides greater surface area contact between the thin film of wavelength converting material and the substrate which may improve thermal dissipation.

DETAILED DESCRIPTION OF THE INVENTION

For a better understanding of the present invention, together with other and further objects, advantages and capabilities thereof, reference is made to the following disclosure and appended claims taken in conjunction with the above-described drawings wherein like numerals represent like parts.

As used herein, the following terms have the following meanings:

"Thin film" means a film of a material that is continuous within its boundaries and has a thickness of less than about twenty micrometers. Preferably, a thin film is deposited by a vapor phase deposition technique such as sputtering, evaporative deposition, laser ablation, chemical vapor deposition, atomic layer deposition, and the like. As used herein, the term "thin film" does not include coatings or layers of particulate materials that may or may not be bound together by an organic material such as a resin or polymer or sintered together to form a solid monolithic piece.

"Translucent" means that a material will allow at least a portion of the light emitted by a light source to pass through it without being absorbed. The term "translucent" also includes materials that are "transparent" whereby the light passes through the material without significant scattering.

"Substantially the same as" means with respect to the patterned surfaces that the arrangement and relative spacing of features in one pattern closely approximates the arrangement and relative spacing of features in another pattern, preferably within ±20% and more preferably within ±10%. It also implies that the general shape of the feature is maintained, e.g., domes or cones, but also contemplates that there may be some obscuring of the shapes caused by the film growth, e.g., corners or points becoming rounded. It also anticipates that the dimensions of the features will be altered by the film growth by at least an amount proportional to the thickness of the film.

References to the color of a phosphor, LED or substrate refer generally to its emission color unless otherwise specified. Thus, a blue LED emits a blue light, a yellow phosphor emits a yellow light and so on.

Figure 1:
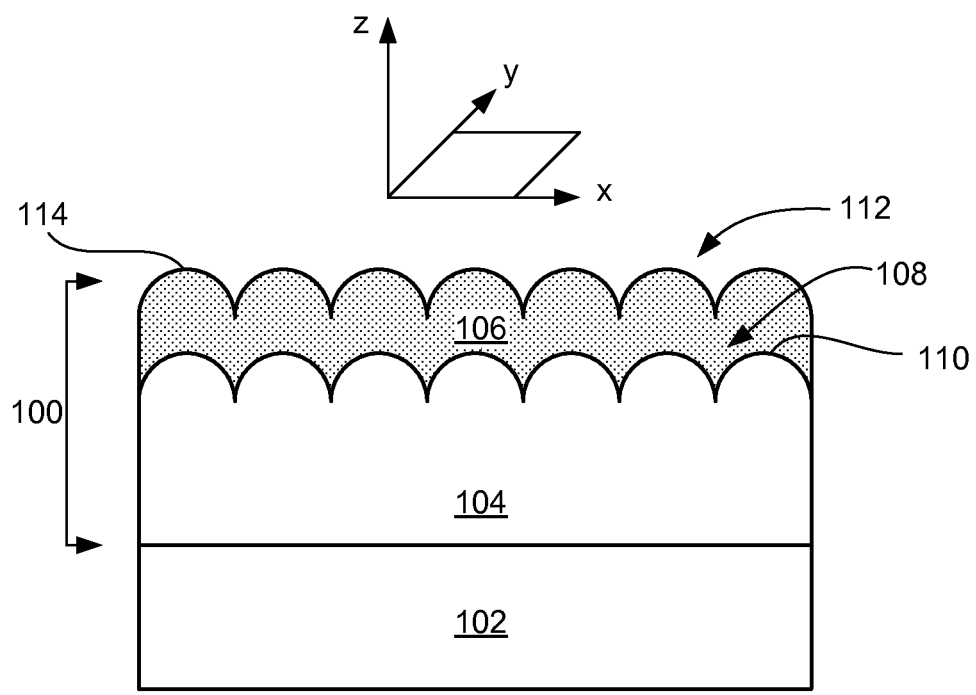
FIG. 1 is a cross-sectional illustration of an embodiment of a patterned thin-film wavelength converter mounted to light emitting diode.

Referring to FIG. 1, there is shown a cross-sectional illustration of an embodiment of a patterned thin-film wavelength converter 100 mounted to the light emitting surface (not labeled) of a light emitting diode (LED) 102. The wavelength converter 100 is comprised of substrate 104 and a thin film 106 of a wavelength converting material. Preferably, the substrate is at least translucent and transmissive with respect to the light emitted by the LED. More preferably, the substrate is a transparent, thermally conductive material such as sapphire. In other embodiments, the substrate 104 may be comprised of other highly thermally conductive materials such as aluminum nitride, boron nitride, yttrium aluminum garnet, polycrystalline diamond, single crystal diamond and beryllium oxide.

It is also not necessary to mount the wavelength converter 100 to the LED. For example, the wavelength converter could be located at a distance from the light emitting surface of the LED. In another embodiment, the wavelength converter 100 could be used in a laser-activated remote phosphor (LARP) application wherein a laser is used as the source of excitation for the wavelength converting material. In such an application, the laser beam may be configured to pass through the substrate 104 (transmissive configuration) or it may be configured to shine directly on the thin film 106 (reflective configuration.)

The wavelength converting material is preferably a garnet-based phosphor which may represented by the general formula $A_3B_5O_{12}$:Ce, wherein A is Y, Sc, La, Gd, Lu, or Tb and B is Al, Ga or Sc. These garnet-based phosphors have a cubic lattice structure and preferably absorb wavelengths in the range from 420 nm to 490 nm. Some preferred garnet phosphors include cerium-activated yttrium aluminum garnet ($Y_3Al_5O_{12}$:$Ce^{3+}$, also referred to herein as YAG:Ce), cerium-activated yttrium gadolinium aluminum garnet (($Y,Gd)_3Al_5O_{12}$:$Ce^{3+}$), cerium-activated lutetium aluminum garnet ($Lu_3Al_5O_{12}$:$Ce^{3+}$), and cerium-activated terbium aluminum garnet ($Tb_3Al_5O_{12}$:$Ce^{3+}$). Preferably, the concentration of cerium in these phosphors is from about 0.001 to about 0.1 moles cerium per mole of phosphor. More preferably, the concentration of cerium is from about 0.005 to about 0.05 moles cerium per mole of phosphor. In other embodiments, the wavelength converting material may be selected from one or more of nitride phosphors such as $M_2Si_5N_8$:$Eu^{2+}$, wherein M=Ca, Sr, Ba; oxynitride phosphors such as $MSi_2O_2N_2$:$Eu^{2+}$, wherein M=Ca, Sr, Ba; and silicate phosphors such as $BaMgSi_4O_{10}$:$Eu^{2+}$, and $M_2SiO_4$:$Eu^{2+}$, wherein M=Ca, Ba, Sr. Alternatively or additionally, the wavelength converting material may be selected from MAlSiN$_3$:Eu, wherein M is a metal selected from Ca, Sr, Ba, and $A_2O_3$:$RE^{3+}$ wherein A is selected from Sc, Y, La, Gd, Lu and $RE^{3+}$ is a trivalent rare earth ion such as $Eu^{3+}$.

Figure 4:
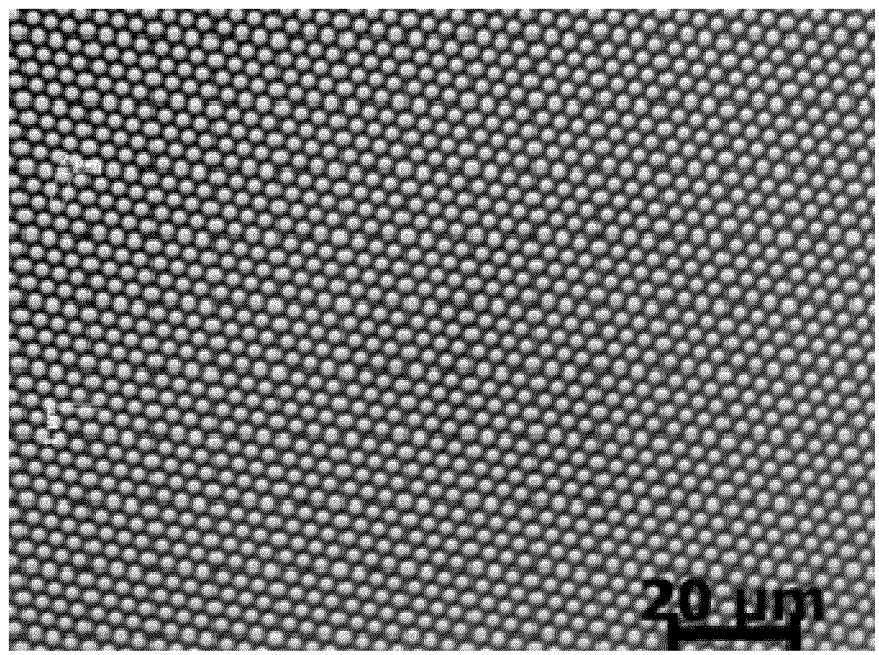
FIG. 4 is a top view of a patterned sapphire substrate having a hexagonal pattern of dome features.

The surface 108 of substrate 104 has a pattern made of repeating first features 110. In this embodiment, the first features 110 are hemispherical domes, however, other shapes are possible including cones, pyramids, and mesas. The first features 110 repeat in a regular pattern in both the x and y directions across the surface 108 of substrate 104. For example, a regular pattern of hexagonally close-packed domes on the surface of a sapphire substrate is shown in FIG. 4. Such patterns of features may be formed by well-known photolithography techniques as used in the semiconductor industry.

The thin film 106 consisting of the wavelength converting material is deposited on the patterned surface 108 of substrate 104. A number of conventional deposition techniques may be used to form the thin film including, but not limited to, chemical vapor deposition, sputtering, evaporation, atomic layer deposition, and pulsed laser deposition. After deposition, the thin film 106 may be subject to further processing including rapid thermal annealing to improve the quantum efficiency of the wavelength converting material. Preferably, the thickness of the thin film is less than 20 µm.

As the thin film 106 is deposited on patterned surface 108 of substrate 104, the film 106 conforms to the first features 110. Once deposited, the thin film 106 has a surface 112 that is distal from substrate 104 and has a pattern of second features 114 which is substantially the same as the pattern of first features 110 on the substrate 104. The pattern of second features 114 may act to reduce total internal reflection within the thin film 106 and thereby enhance light extraction from the wavelength converter 100. The pattern of second features 114 may also be designed to achieve other aims such as controlling color variances over the angular distribution of the emitted light. The increased surface contact with the substrate may also aid in the dissipation of heat caused by Stokes-shift losses and other non-radiative losses within the wavelength converting material. Better heat conduction away from the conversion material lessens the likelihood of thermal quenching and allows for the use of higher output LEDs or laser diodes as sources of excitation.

Figure 2:
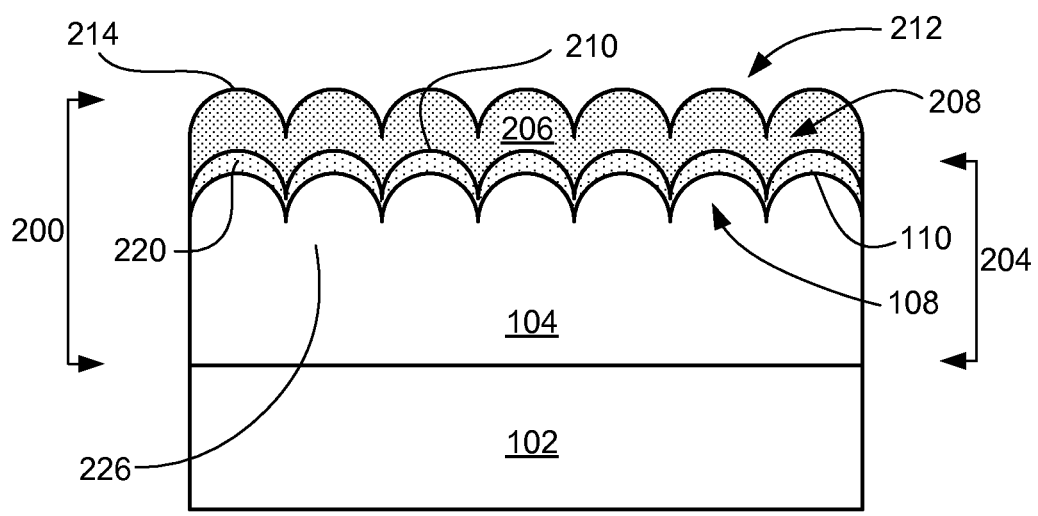
FIG. 2 is a cross-sectional illustration of another embodiment of a patterned thin-film wavelength converter mounted to light emitting diode.

Referring now to FIG. 2, there is shown a cross-sectional illustration of another embodiment of a patterned thin-film wavelength converter according to this invention. As above, substrate 104 has a patterned surface 108 comprised of first features 110. However, in this case, the substrate 104 of wavelength converter 200 is coated with an intermediate layer 220. As described above, the substrate 104 may be comprised of a transparent, thermally conductive material such as sapphire whereas the intermediate layer 220 may be comprised of a different material such as cerium oxide, $Si_3N_4$, ZnO, $HfO_2$, GaN, $Ta_2O_5$, and $WO_3$. The intermediate layer 220 is conformal and has patterned surface 208 which substantially replicates the patterned surface 108 of substrate 104. The thin film 206 of the wavelength converting material is deposited on the patterned surface 208 of intermediate layer 220. The surface 212 of thin film 206 that is distal from the patterned surface 208 of intermediate layer 220 has a pattern of features 214 that is substantially the same as the pattern of features 110, 210 of intermediate layer 220 and substrate 104. One advantage of using an intermediate structure layer between the thin film 206 and substrate 104 is that it may be possible to employ a laser or chemical lift-off method to remove the thin film 206 from the substrate 104 in order to apply it to a further substrate such as an LED, for example, by mounting it to the LED using a silicone adhesive. In this way, an enhanced outcoupling may be achieved between materials having different indices of refraction. Moreover, since substrate 104 is removed, it may not be necessary that the substrate be composed of a light transmissive material and may therefore comprise any suitable material for supporting intermediate layer 220.

In an alternate embodiment, if the wavelength converter 200 is intended for a reflective LARP application, the intermediate layer 220 may be designed as a reflective coating which reflects both the primary laser light incident on the converter and the secondary light emitted by the wavelength converting material. Moreover, since the laser light is directed onto the thin film 206 rather than through substrate 104, there is no need for substrate 104 to be light transmissive. Alternatively, when a light transmissive substrate such as sapphire is used, a dichroic coating may be applied to the underside of substrate 104 that faces the LED 102. The dichroic coating may be designed to transmit primary light emitted by the LED 102 and reflect secondary light emitted by the wavelength converting material of thin film 206. The dichroic coatings may also be applied to the thin film after annealing.

Figure 3A:
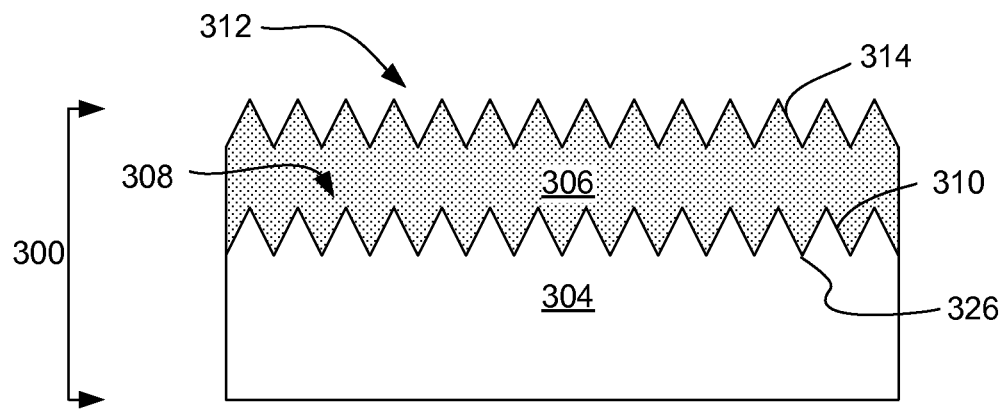
FIG. 3A is a cross-sectional illustration of yet another embodiment of a patterned thin-film wavelength converter according to this invention.
Figure 3B:
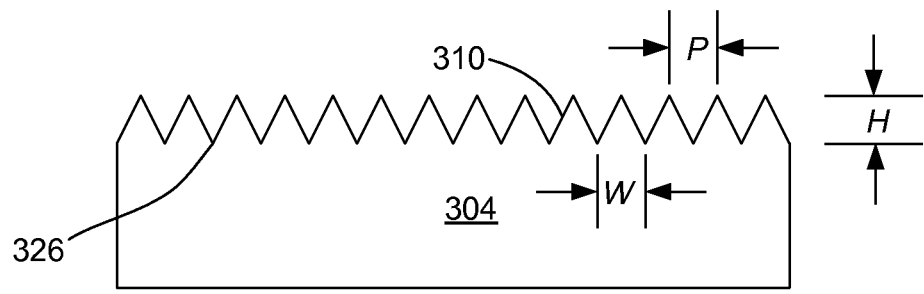
FIG. 3B is a cross-sectional illustration of the substrate of FIG. 3A alone.

FIGS. 3A and 3B show cross-sectional illustrations of patterned thin-film wavelength converter 300 and its substrate 304 alone, respectively. In this embodiment, the first features 310 of the patterned surface 308 of substrate 304 are pyramidal in shape and extend laterally over the surface 108 in a rectangular array. The first features 310 have a height H which preferably ranges from 100 nm to 10 µm, and more preferably from 1 µm to 3 µm and a base width W that ranges from 200 nm to 20 µm, and more preferably from 2 µm to 6 µm. Although the first features 310 are shown as touching each at a junction 326 at their bases, it is not necessary for the features on the patterned substrate surface to be in direct contact with one another, i.e., there may be for example an intervening flat space (or gap) between each feature. Nonetheless, it is preferred that the features have a pitch P (center-to-center distance) of 200 nm to 20 µm, and more preferably from 2 µm to 6 µm. It is also possible for the features to be arranged in a regular pattern, e.g., a hexagonal, rectangular, or triangular arrangement, or a random or pseudo-random arrangement wherein the features are arranged with a varying pitch, or have varying heights or widths. Such random or pseudo-random arrangements may provide an enhanced extraction with an unstructured emission pattern and may be generated by chemical etching (e.g., $H_3PO_4$ or KOH etching) or sandblasting of the substrate.

EXAMPLES

Sapphire substrates in the form of wafers had their surfaces structured in hexagonal pattern of domes with a 3.5 µm pitch; 1.2-1.6 µm height and 0.5-1 µm gaps between adjacent features. The patterned surface of the sapphire substrate is evident in the optical photomicrograph shown in FIG. 4. The sapphire substrates were heated to 700° C. in 3 mTorr oxygen partial pressure in a vacuum chamber in order to deposit a thin film of a YAG:Ce phosphor by a pulsed laser deposition technique. The distance between target and substrate was kept at approximately 7 cm. The rotational speeds of the target and substrate were 79 rpm and 100 rpm, respectively. The deposition rate of the YAG:Ce phosphor was about 1 µm/hr. After the deposition, the wafers were annealed at 1600° C. to achieve a quantum efficiency value greater than 90 percent.

Figure 5:
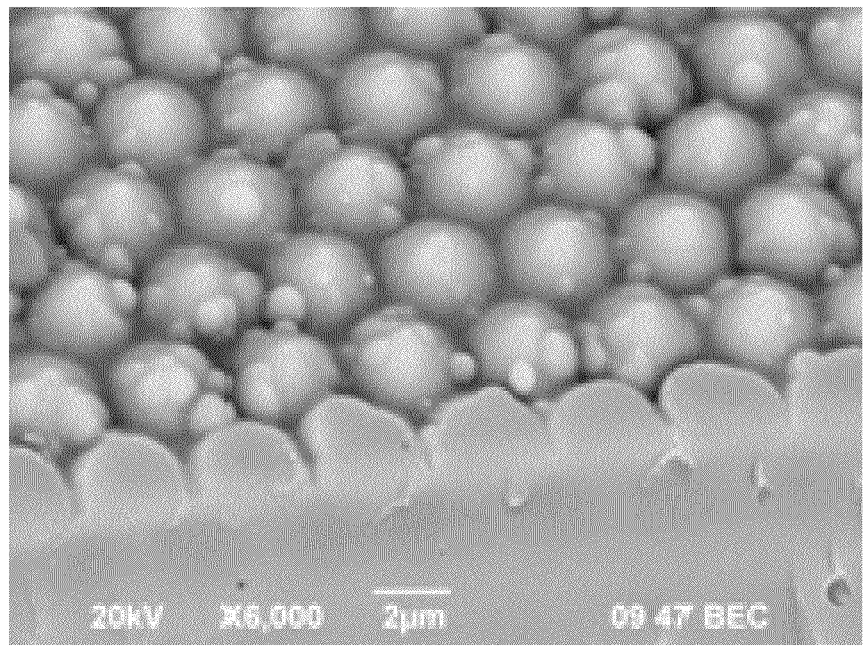
FIG. 5 is an SEM photomicrograph of the surface of a YAG:Ce thin film after deposition on a patterned sapphire substrate.
Figure 6:
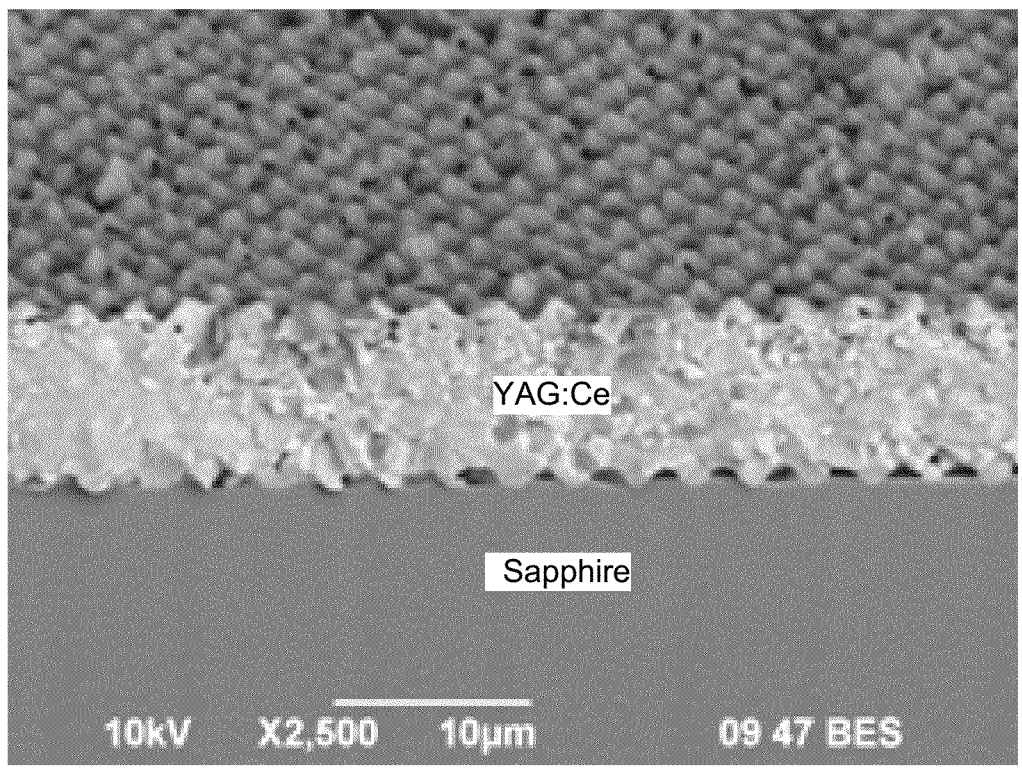
FIG. 6 is a cross-sectional SEM photomicrograph of a YAG:Ce thin film after deposition on a patterned sapphire substrate.

FIG. 5 is an SEM photomicrograph of the surface of the YAG:Ce thin film after deposition on the patterned sapphire substrate. The image of the surface shows that the underlying pattern on the sapphire substrate has transferred to the top surface of the thin film which is distal from the substrate. This may be further observed in FIG. 6 which is a SEM photomicrograph showing a cross section of the thin film on the substrate. The thickness of the YAG:Ce layer was measured to be approximately 10 µm.

Figure 7:
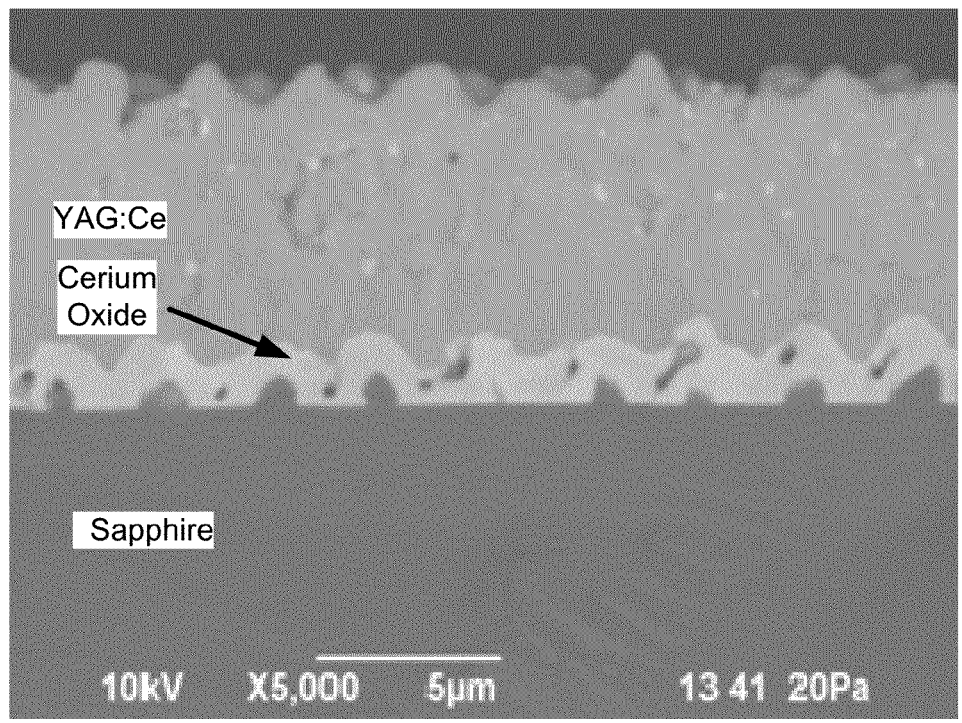
FIGS. 7 and 8 are cross-sectional SEM photomicrographs of a YAG:Ce thin film after deposition on a patterned sapphire substrate having an intermediate cerium oxide layer.
Figure 8:
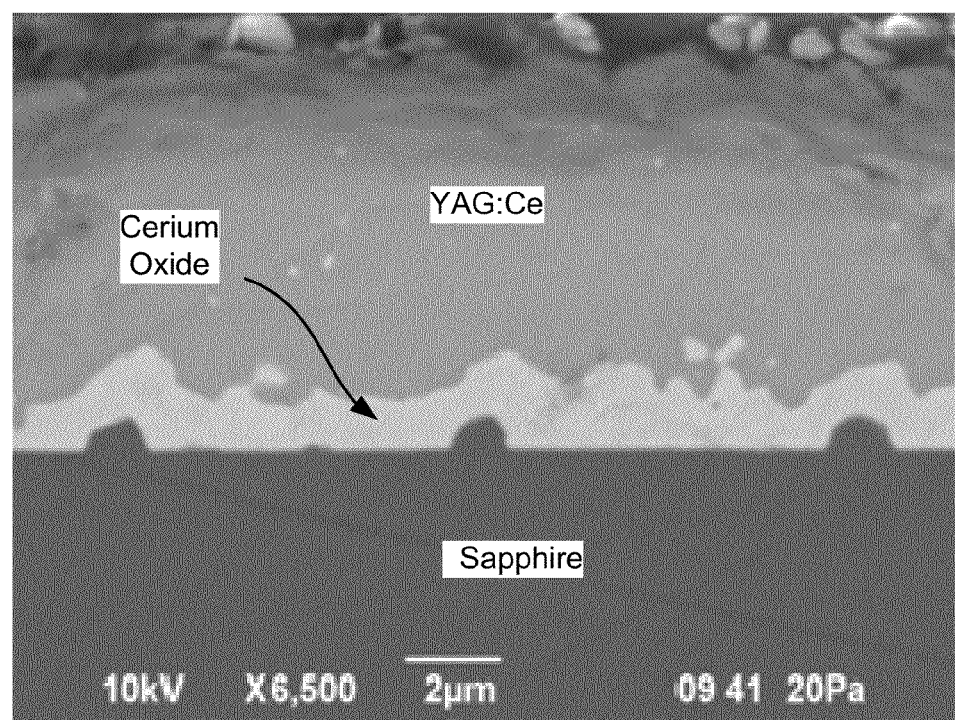

An example of the embodiment described in respect of FIG. 2 is shown in the SEM photomicrographs of FIGS. 7 and 8. In this case, a thin film of a YAG:Ce phosphor was deposited on a structured intermediate cerium oxide layer whereby the patterned surface of the cerium oxide layer is transferred to the surface of the YAG:Ce thin film which is distal from the structured cerium oxide layer. The thickness of the YAG:Ce layer was measured to be approximately 7 µm and the thickness of the structured $CeO_2$ layer including the features was about 1.75 µm.

Figure 9:
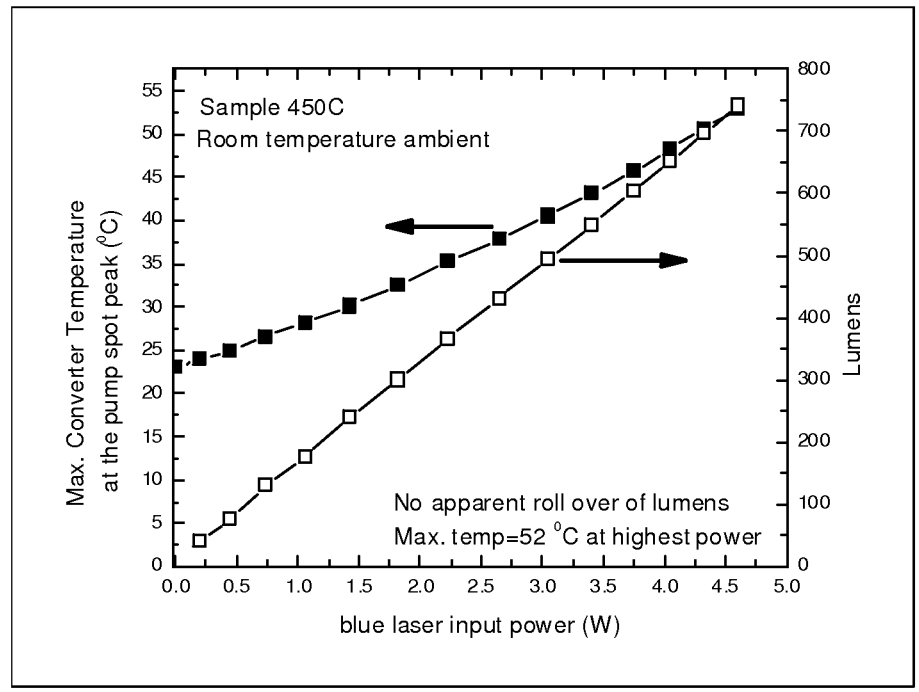
FIGS. 9 and 10 are graphical representations of the performance of a patterned thin-film wavelength converter under room temperature and 75° C. ambient conditions, respectively.
Figure 10:
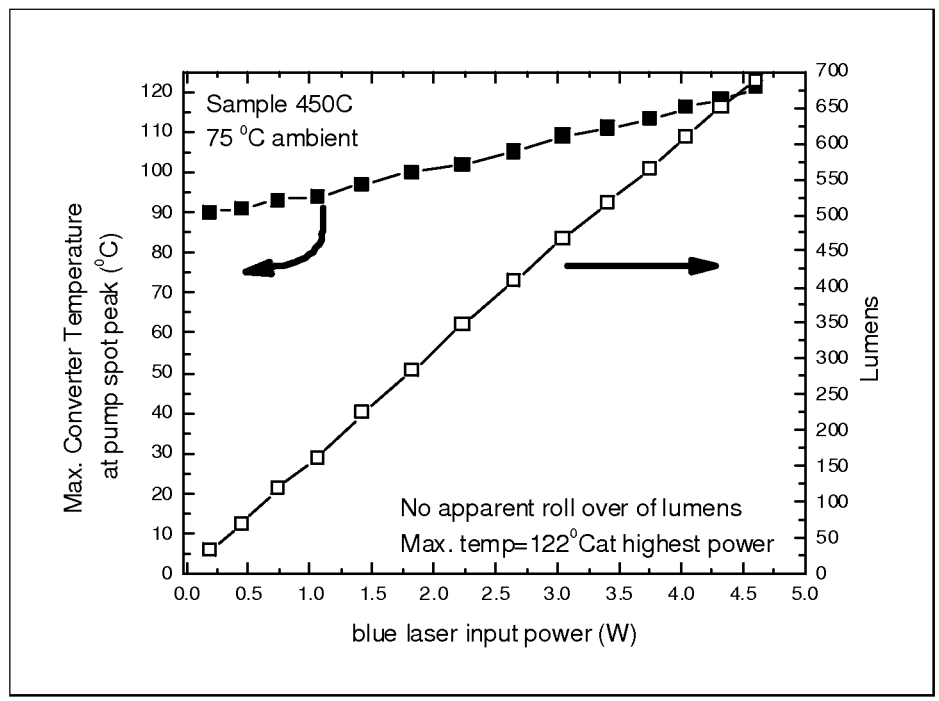

FIGS. 9 and 10 show the performance of a patterned thin-film wavelength converter according to this invention. The converter was prepared using a pulsed laser deposition thin film technique as described above. A KrF excimer laser (λ=248 nm) was used for the ablation of a YAG:Ce (4%) phosphor target in a oxygen partial pressure of 3 mTorr. A patterned sapphire substrate was placed on a rotating heater. The substrate was heated to 700° C. and the deposition was performed at a laser fluence of ~2 J/cm$^2$. Prior to insertion of the substrate into the chamber, the wafer was ultrasonically cleaned with acetone and methanol. After the deposition, the wafers were annealed at 1600° C. to achieve a quantum efficiency value greater than 90 percent. The wavelength converter was kept at room temperature and 75° C. ambient during the measurements. Closed squares represent the change in substrate temperature as the blue input laser power increases. Open squares represent the total lumen output with increasing blue input laser power. The arrows indicate the y-axes on which the data are plotted with respect to x-axis. The data shows that the converter performed well at high substrate temperatures with no indication of thermal quenching.

Figure 11:
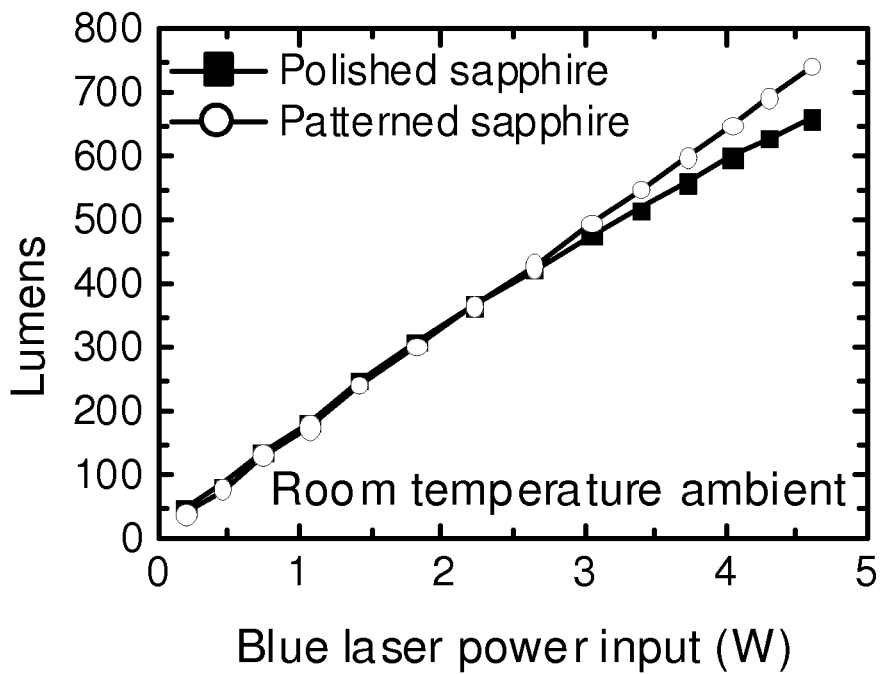
FIG. 11 compares the lumen output versus blue laser input power for thin-film wavelength converters having polished sapphire and patterned sapphire substrates.

FIG. 11 compares the lumen output versus blue laser input power for thin-film wavelength converters having polished sapphire and patterned sapphire substrates. The higher lumen output at higher input power levels for the converter with the patterned sapphire substrate indicates that the patterned substrate provides greater heat dissipation helping to reduce thermal quenching of the wavelength converting material.

Figure 12:
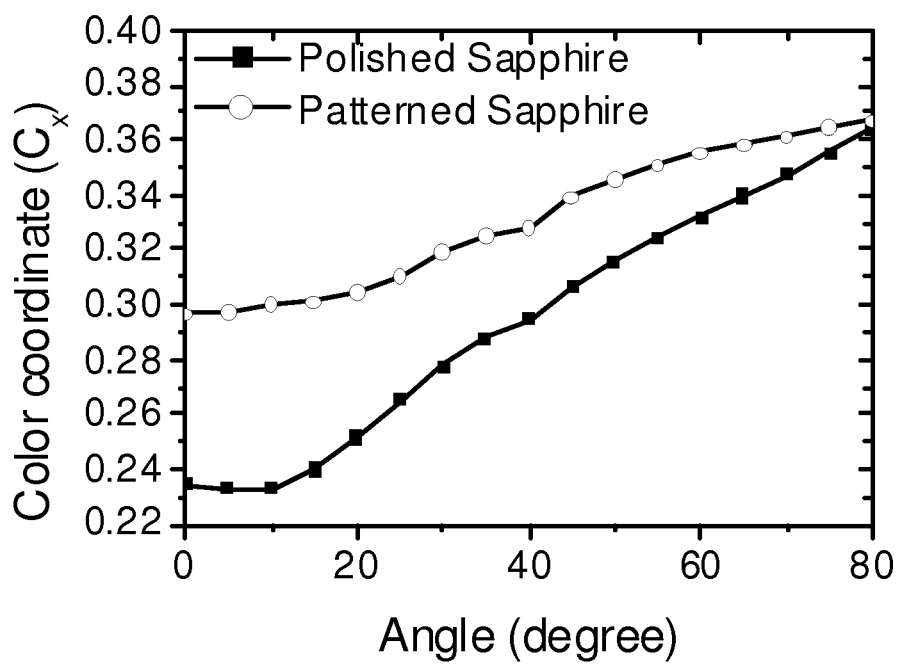
FIG. 12 compares color over angle performance for thin-film wavelength converters having polished sapphire and patterned sapphire substrates.

FIG. 12 compares the color over angle performance for thin-film wavelength converters having polished sapphire and patterned sapphire substrates. For the converter with the patterned sapphire substrate, the data shows that there is less variation in the x color coordinate ($C_x$) of the emitted light as a function of viewing angle. This demonstrates that a better color over angle performance may be achieved with the patterned thin-film wavelength converter of this invention.

While there have been shown and described what are at present considered to be preferred embodiments of the invention, it will be apparent to those skilled in the art that various changes and modifications can be made herein without departing from the scope of the invention as defined by the appended claims.

What is claimed is:

1. A method of making a patterned thin-film wavelength converter, comprising:
   (a) obtaining a substrate having a patterned surface with a pattern of features;
   (b) depositing a conformal intermediate layer on the patterned surface of the substrate;
   (c) depositing a thin film consisting of a wavelength converting material on the intermediate layer on the patterned surface of the substrate so that a surface of the thin film distal from the substrate has a pattern that is substantially the same as the pattern of the substrate; and
   (d) removing the thin film from the substrate by a laser or chemical lift-off technique to obtain the patterned thin-film wavelength converter.

2. The method of claim 1, wherein the intermediate layer is selected from cerium oxide, $Si_3N_4$, ZnO, $HfO_2$, GaN, $Ta_2O_5$, and $WO_3$.

3. The method of claim 1, wherein the intermediate layer comprises cerium oxide.

4. The method of claim 1, wherein the wavelength converting material is a garnet-based phosphor having a general formula $A_3B_5O_{12}$:Ce, wherein A is Y, Sc, La, Gd, Lu, or Tb and B is Al, Ga or Sc.

5. The method of claim 1, wherein the substrate is selected from aluminum nitride, boron nitride, yttrium aluminum garnet, polycrystalline diamond, single crystal diamond and beryllium oxide.

6. The method of claim 1, wherein the features have a shape selected from domes, cones, pyramids, and mesas.

7. The method of claim 1, wherein the pattern of features is selected from a hexagonal pattern, a triangular pattern and a rectangular pattern.

8. The method of claim 1, wherein the features have a height from 100 nm to 10 μm.

9. The method of claim 1, wherein the features have a height from 1 μm to 3 μm.

10. The method of claim 1, wherein the features have a base width from 200 nm to 20 μm.

11. The method of claim 1, wherein the features have a base width from 2 μm to 6 μm.

12. The method of claim 1, wherein the features have a pitch from 200 nm to 20 μm.

13. The method of claim 1, wherein the features have a pitch from 2 μm to 6 μm.

14. The method of claim 1, wherein the method further comprises attaching the patterned thin-film wavelength converter to a light emitting diode uses a silicone adhesive.

* * * * *